(12) United States Patent
Eckberg et al.

(10) Patent No.: US 10,334,749 B2
(45) Date of Patent: *Jun. 25, 2019

(54) ENHANCED RACK/CABINET MOBILITY AND STABILITY FOR A SERVER RACK

(71) Applicant: INTERNATIONAL BUSINESS MACHINES CORPORATION, Armonk, NY (US)

(72) Inventors: Eric A. Eckberg, Rochester, MN (US); Cody J. Erie, Adams, MN (US); Michael J. MacPherson, Elgin, MN (US); Stephen P. Mroz, Rochester, MN (US); Christopher L. Tuma, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/729,725

(22) Filed: Oct. 11, 2017

(65) Prior Publication Data

US 2018/0213673 A1 Jul. 26, 2018

Related U.S. Application Data

(63) Continuation of application No. 15/416,036, filed on Jan. 26, 2017, now Pat. No. 10,172,255.

(51) Int. Cl.
*H05K 7/18* (2006.01)
*B60B 33/00* (2006.01)
(Continued)

(52) U.S. Cl.
CPC ........... *H05K 7/18* (2013.01); *B60B 33/0002* (2013.01); *B60B 33/006* (2013.01);
(Continued)

(58) Field of Classification Search
CPC ........ H05K 7/183; H05K 7/1488; H05K 7/18; Y10T 16/182; Y10T 16/18; Y10T 16/186;
(Continued)

(56) References Cited

U.S. PATENT DOCUMENTS

| 5,590,938 A | 1/1997 | De Andrea |
| 7,163,214 B1 * | 1/2007 | Bratton, Sr. ........... A63D 15/00 280/79.11 |

(Continued)

FOREIGN PATENT DOCUMENTS

WO 02093705 A2 11/2002

OTHER PUBLICATIONS

IBM: List of IBM Patents or Patent Applications Treated as Related (Appendix P), Jan. 3, 2018, 2 pages.

(Continued)

*Primary Examiner* — William L Miller
(74) *Attorney, Agent, or Firm* — Teddi E. Maranzano

(57) ABSTRACT

A mobility apparatus. The mobility apparatus may include a continuous fixed-length rail attached horizontally to a bottom structural member of the front or the rear of a server rack. The continuous fixed-length rail exceeds a width of the server rack by an equal amount on either side of the server rack. The mobility apparatus also includes a lower rail portion attached to a lower edge of the continuous fixed-length rail; a raised rail portion attached to an extended length of each portion of the continuous fixed-length rail; and at least one wheel attached to an underside of each end of the extended length of the continuous fixed-length rail.

1 Claim, 7 Drawing Sheets

(51) Int. Cl.
   *H05K 7/14* (2006.01)
   *B60B 33/06* (2006.01)
(52) U.S. Cl.
   CPC ...... *B60B 33/0063* (2013.01); *B60B 33/0078* (2013.01); *B60B 33/063* (2013.01); *H05K 7/1488* (2013.01); *H05K 7/183* (2013.01); *B60B 33/06* (2013.01); *Y10T 16/182* (2015.01)
(58) Field of Classification Search
   CPC ..... Y10T 16/19; Y10T 16/195; Y10T 16/205; Y10T 16/209; Y10T 16/193; B60B 33/0002; B60B 33/0063; B60B 33/0078; B60B 33/06; B60B 33/006; B60B 33/063; B60B 33/04; G06F 1/181
   USPC ...... 16/19, 18 R, 20, 29, 35 R, 40, 42 R, 32; 361/797; 312/249.8, 223.2
   See application file for complete search history.

(56) References Cited

U.S. PATENT DOCUMENTS

| | | | |
|---|---|---|---|
| 7,540,509 | B1 | 6/2009 | Boraas et al. |
| 7,699,180 | B2 | 4/2010 | Mollard et al. |
| 8,141,885 | B2 | 3/2012 | Fan et al. |
| 8,240,685 | B2 | 8/2012 | Fan |
| 8,480,192 | B2 | 7/2013 | Yuan et al. |
| 9,408,326 | B2 | 8/2016 | Lewis, II et al. |
| 9,743,543 | B2 | 8/2017 | Anderson et al. |
| 2002/0172013 | A1 | 11/2002 | Chandler |
| 2007/0210680 | A1 | 9/2007 | Appino et al. |
| 2014/0027392 | A1 | 1/2014 | Crippen et al. |
| 2015/0130339 | A1 | 5/2015 | Barnett |
| 2016/0029504 | A1 | 1/2016 | Nordin et al. |
| 2016/0360638 | A1 | 12/2016 | Hewitt et al. |
| 2017/0034935 | A1 | 2/2017 | Anderson et al. |
| 2017/0150636 | A1 | 5/2017 | Segroves et al. |
| 2017/0217465 | A1 | 8/2017 | Jost et al. |

OTHER PUBLICATIONS

IBM, "Installation Guide", S2 42U Dynamic Standard Rack, S2 42U Dynamic Expansion Rack, First Edition (Mar. 2009), see pp. 8-12 note—side outriggers only, 84 pages.

Pending U.S. Appl. No. 15/416,036, filed Jan. 26, 2017, entitled: "Enhanced Rack/Cabinet Mobility and Stability for a Server Rack", 21 pages.

\* cited by examiner

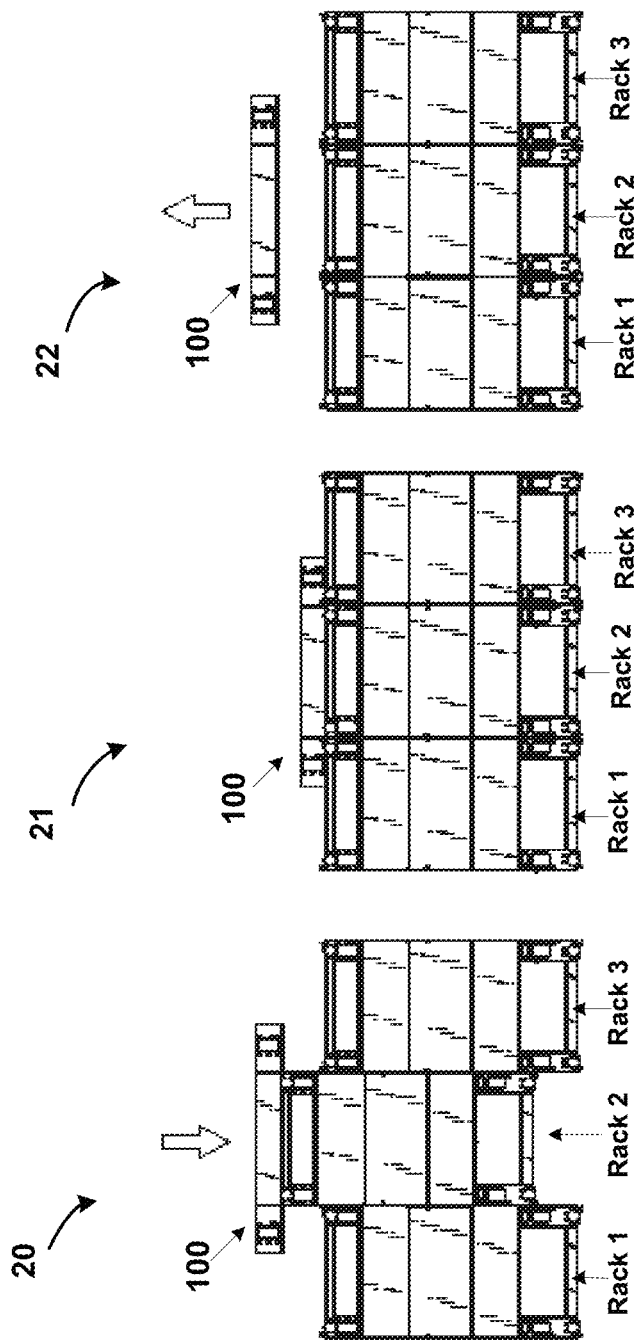

ENHANCED RACK/CABINET MOBILITY AND STABILITY FOR A SERVER RACK

BACKGROUND

The present invention generally relates to rack-mounted electronic systems and equipment racks, and more particularly to enhanced cabinet (i.e., rack) mobility and stability for a server rack.

A potential tipping hazard exists when moving a server rack within a customer datacenter. The tipping hazard is particularly acute during the installation of the rack, which includes maneuvering the rack into position and aligning the rack with the other racks.

SUMMARY

According to one embodiment of the present invention, a mobility apparatus is provided. The mobility apparatus may include a continuous fixed-length rail attached horizontally to a bottom structural member of a front or a rear of a server rack. The continuous fixed-length rail exceeds a width of the server rack by an equal amount on either side of the server rack. The mobility apparatus also includes a lower rail portion attached to a lower edge of the continuous fixed-length rail; a raised rail portion attached to an extended length of each portion of the continuous fixed-length rail; and at least one wheel attached to an underside of each end of the extended length of the continuous fixed-length rail.

According to another embodiment of the present invention, a mobility apparatus is provided. The mobility apparatus includes a left-hand rail portion and a right-hand rail portion each attached horizontally to a bottom structural member of a front or a rear of a server rack; a lower rail portion permanently attached to a lower edge of each of the left-hand rail portion and the right-hand rail portion; a raised rail portion permanently attached to an extended length of the left-hand rail portion and the extended length of the right-hand rail portion; and at least one wheel attached to the extended length of each of the left-hand rail portion and the right-hand rail.

BRIEF DESCRIPTION OF THE DRAWINGS

The following detailed description, given by way of example and not intended to limit the invention solely thereto, will best be appreciated in conjunction with the accompanying drawings, in which:

FIG. 7 is a top view of a rack inserted between two installed racks, according to an embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
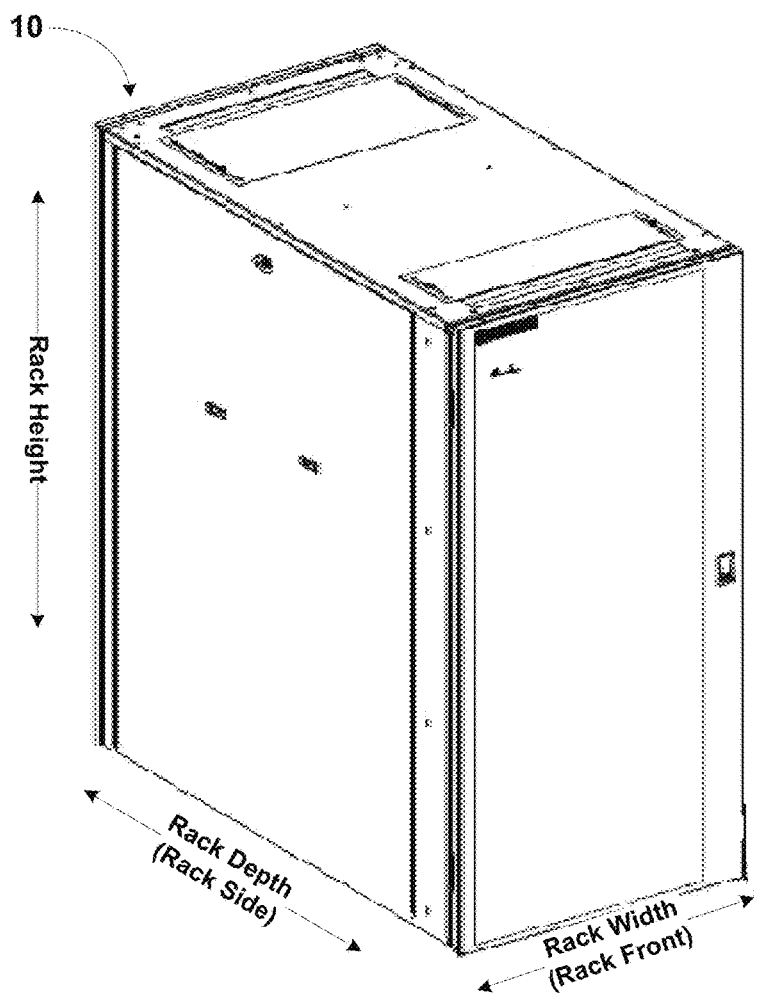
FIG. 1 is an isometric view of a rack, according to an embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Figure 2:
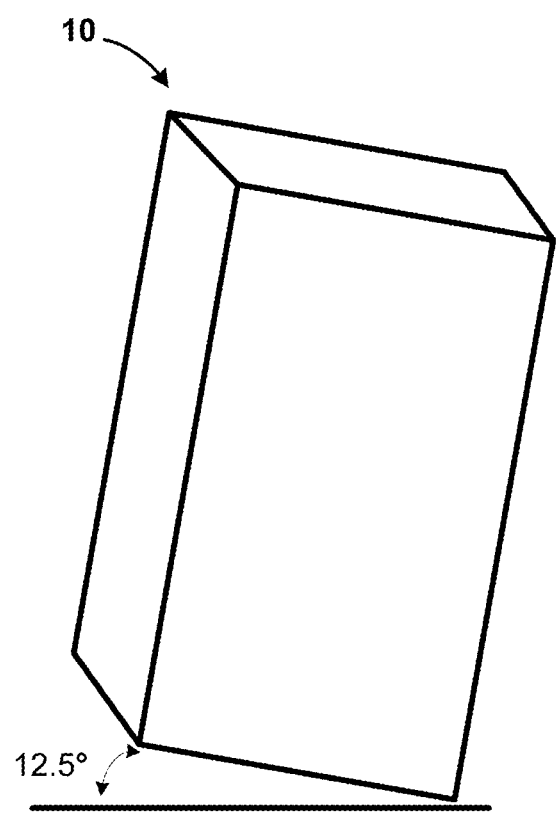
FIG. 2 is an alternate view of a rack, tilted at 12.5° from horizontal.

The present invention generally relates to enhanced cabinet (i.e., rack) mobility and stability for a server rack. An enterprise's product safety engineers may test a populated rack configuration to ensure compliance with government and industry safety standards. For example, rack design that produces a static tilt of up to approximately 12.5° (shown in FIG. 2) may be an acceptably safe design in a dynamic environment, such as when moving the populated rack on its casters. FIG. 2 shows the static tilt formed by a side edge of the rack and the horizontal surface (i.e., the floor). The static tilt may also be formed by a front or back edge of the rack and the horizontal surface.

Generally, meeting product safety tip/tilt requirements for electronic rack designs involves additional safety measures. The Electronic Industries Alliance (EIA) is an industry standards organization that promotes, among other measurements, standard interior and exterior rack dimensions. The height of an EIA-compliant rack is measured in standard rack units of approximately 44.45 mm (1.75 in) each. The typical full-size rack is 42 rack units (U) high.

Standardizing measurements implies that equipment can be interchangeably installed in racks of any manufacturer, and is not limited to being installed in only racks from the equipment manufacturer. Standardization facilitates datacenter management, since floor space for future racks can be reliably planned. Additionally, equipment and racks can be replaced without impacting other racks that are currently installed.

To prepare a rack that is fully populated with equipment for shipment, as much as half of the equipment is depopulated from the the upper locations of the rack, for example locations above approximately 32 U, to lower the overall center of mass and make the rack more stable. The depopulated equipment is shipped separately and re-installed at the customer datacenter. It should be noted that prior to shipment, as part of the final integration and test, the rack is installed and configured with the equipment and options ordered by the customer. It would be advantageous to ship the tested rack at this point. However, the extra steps of partially depopulating, shipping the equipment separately and re-installing the depopulated equipment at the customer data center are performed. This results in additional labor and shipping costs to the customer.

Optionally, ballast weight is added to the bottom of the rack to lower the overall center of mass. Preferably, the ballast weight, such as welded-in steel ballast, is fixed to the rack to prevent shifting. The customer may incur costs to re-evaluate the structural capacity of the data center raised floor to ensure the rack, plus additional ballast weight, can be safely installed. The customer may also incur costs for the additional ballast weight and the increased shipping costs because of the added weight.

Similarly, outrigger extensions, in varying configurations, may be attached parallel to each rack side (FIG. 1) to widen the wheel base. Typically, the tipping hazard is more acute from side to side because the rack is narrow relative to its height. As currently practiced, the side-attached outrigger extensions cannot remain attached when sliding the rack into a location between two installed racks, as in FIG. 7, because the attached outrigger extensions increase the rack width to a measurement greater than that of the install location. Therefore, the attached outrigger extensions are removed before sliding the rack into the final installed position. This raises a product safety exposure, since the rack becomes unstable during the outrigger extension removal, and while sliding the rack into final position.

Ideally, it may be desirable to attach extension wheels parallel to the rack, to provide stability, yet to safely allow placing the rack into its final installed position prior to removing the extension wheels. The wheels may be attached to either the front of the rack, or to the rear of the rack. Embodiments of the present invention are described with reference to attaching the wheels to the front of the frame. However in an embodiment, the wheels may be attached to the rear of the frame instead. The embodiments of attachable extension wheels are described in detail below referring to the accompanying drawings FIGS. 1-6.

FIG. 1 illustrates a typical rack (not to scale) into which computing equipment, including power supplies, network switches, computer servers, and storage devices, may be installed. The following embodiments are illustrated using an exemplary standard 42 U rack, having an overall external rack width of approximately 644 mm (25.4 in.), an overall external rack depth of approximately 1098 mm (43.3 in.), and an overall height of approximately 2015 mm (79.3 in.). However, the various embodiments are not so limited, and may be applied to racks of other dimensions. As FIG. 1 illustrates, the rack occupies a generally rectangular footprint on the data center floor. The side to side tipping hazard exists because the rack width is less than the rack depth, and the rack width is narrow relative to the rack height.

Figure 3:
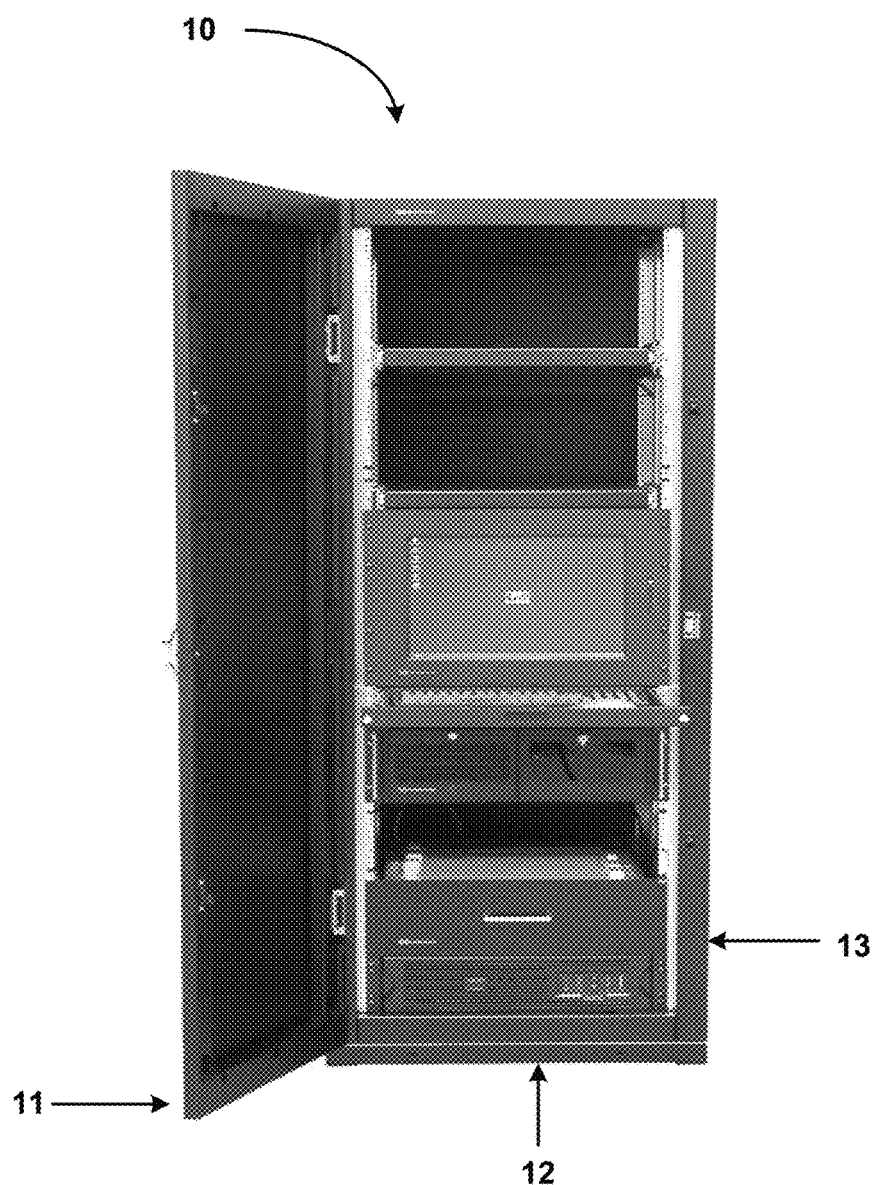
FIG. 3 is a front view of a rack.
Figure 4:
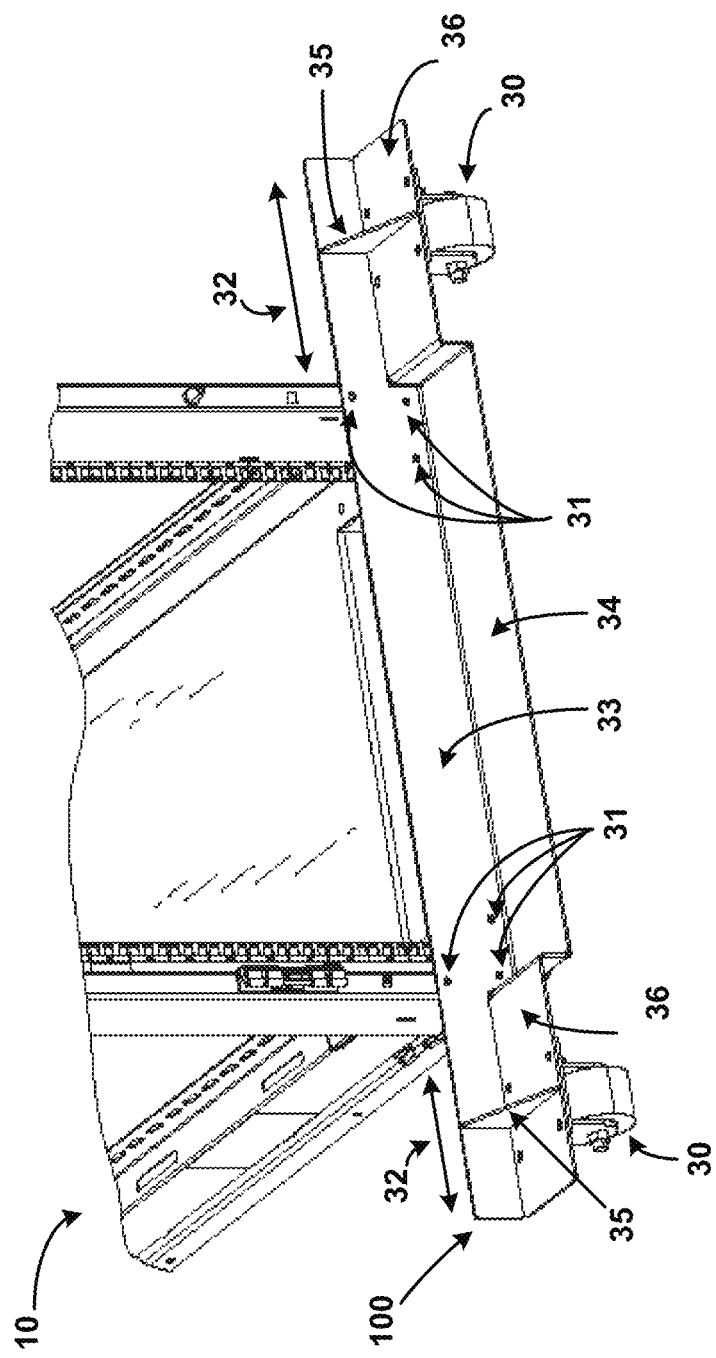
FIG. 4 is an isometric view of a rack with mobility structure attached, according to an embodiment.

Referring now to FIGS. 3-4, a front view (FIG. 3) and an isometric view (FIG. 4) of a server rack 10 with structure 100 installed are illustrated, according to an embodiment.

FIG. 3 illustrates the server rack 10, having an installed front door 11, bottom structural member 12 and side structural members 13.

FIG. 4 is an isometric view of a server rack 10 with structure 100 installed, according to an exemplary embodiment. Structure 100 is an extension system that may be attached to either the front or rear of a rack to provide stability for a server rack, particularly during installation. Structure 100 may be made of any material known in the art, such as steel. In the illustrated embodiment, structure 100 includes a continuous fixed-length rail 33, two raised portions of rail 36, a lower rail portion 34, two wheels 30, six total attachment points 31, and two strengtheners 35.

The continuous fixed-length rail 33 is attached to the bottom structural member 12, parallel to the front of the server rack 10 and parallel to the floor. To more clearly illustrate the structure 100, the server rack 10 is shown without the front door. However, the structure 100, may not prevent an attached front door from opening. As shown in FIG. 3, the front door 11 of the server rack 10 does not extend beyond, i.e., cover, the bottom structural member 12 of the server rack 10, thus permitting attachment of the structure 100 without impairing the operation of the front door 11.

The continuous fixed-length rail 33 of the structure 100 is attached to the bottom structural member 12 of the server rack 10 at attachment points 31. For structural strength, three attachment points 31 are configured in a triangular pattern along the side structural member 13 and the bottom structural member 12 of the server rack 10. The structure 100 is attached to the server rack 10 as part of the preparation for shipping, and typically remains attached until the server rack 10 arrives at the datacenter and is rolled into its final position. Therefore, the continuous fixed-length rail 33 may be attached temporarily to the bottom structural member 12 by appropriate removable fasteners, such as bolts and screws. The attachment point holes may come in different shapes and sizes, such as, for example, bolt holes, threaded holes for #12-24 or #10-32 screws, tapped holes, or square holes. The number, size, and placement of the attachment points 31 may be configured according to the design of the particular server rack 10, and thus may differ from the embodiment shown in FIG. 4. However, the exemplary embodiment of FIG. 4, permits mobility and installation of the server rack 10, unimpaired operation of the front door 11, and removal of the structure 100 once the server rack 10 is installed, as for example, between two existing racks.

It should be understood that the rear of the server rack 10 has structural members corresponding to those of the front of the server rack 10, including a rear door, rear bottom structural member, and attachment points. The structural members of the rear of the server rack perform substantially similar functions as those on the front of the server rack 10. Consequently, FIG. 4 may show either the front or the rear of a server rack.

The length of the continuous fixed-length rail 33 may be determined in terms of the height, width, and depth proportions of the server rack 10. For the standard 42 U frame of the present embodiment, the length of the continuous fixed-length rail 33 is approximately 1.0 m (39.37 in.).

The extended length 32 and the rack side form two sides of a triangle, with the apex being the rear wheel of the server rack 10. In the FIG. 4 embodiment, each extended length 32 is approximately 0.5 m (19.6 in.). The length of the extended length 32 depends, in part, on the height, depth and width of the rack. For example, the length of the extended length 32 may be increased to compensate for a longer rack depth because the rack depth affects the overall rack stability by changing the dimensions of the formed triangle. Consequently, adjusting the extended length 32 permits customizing the structure 100 to server racks of different dimensions, while preserving safety standards.

Other considerations that affect the length of the extended length 32 include well-known standard measurements used in datacenter management and planning. These specify, among other things, the distance between rows of installed server racks, and the width of door openings in the datacenter and in the freight elevators, all of which affect rack placement and maneuverability. The measurements and available floor space in the shipping vehicle, such as a truck or cargo container, also influence the length of the extended length 32. For example, the server rack 10 and the attached structure 100 may be fixed to a pallet and loaded on the shipping vehicle. The overall length of the structure 100 affects the width of the pallet, which, in turn, affects the number of pallets that the shipping vehicle can hold. Therefore, efficient and economical use of shipping space may influence the length of the extended length 32.

Two raised portions of rail 36 are permanently attached, for example welded, to and are substantially perpendicular to, the extended portions of the continuous fixed-length rail 33. Therefore, the strengthener 35 is substantially a right triangle which is permanently attached, for example welded, to the raised rail portion 36 and the extended portion of the continuous fixed-length rail 33. The placement of the strengthener 35 as shown, may improve transfer of the weight of the server rack 10 to the wheel 30. The strengthener 35 may also add stability and strength to the weld that permanently joins the raised portion of rail 36 to the continuous fixed-length rail 33 along the extended length 32. However, the strengthener 35 may be located elsewhere along the raised rail portion 36. Additionally, the strengthener 35 may be eliminated, for example, if the structure 100 is manufactured from a sufficiently heavy gauge material.

The lower rail portion 34 is permanently attached, for example welded, to and is substantially perpendicular to, the lower edge of the continuous fixed-length rail 33. The raised rail portion 36 and the lower rail portion 34 are not a continuous rail or surface. The lower rail portion 34 is positioned such that the attachment points 31 are exposed. Consequently, the server rack 10 may be installed between existing racks and the structure 100 may be detached by unfastening the temporary removable fasteners at the attachment points 31. In implementations where access to the interior of the server rack 10 is needed to remove the temporary fasteners at the attachment points 31, such as bolts and nuts, the front door 11 may be opened or removed, as necessary.

The standard server rack 10 is typically equipped with an internal wheel at each of its corners. The internal wheels substantially support the server rack 10 during moving, and aid in levelling the server rack 10 during installation. The wheels 30 of the structure 100 provide additional stability and support by contacting the floor if the server rack 10 begins to tip, thus preventing the server rack 10 from exceeding the maximum 12.5° angle from horizontal. Having the wheel 30 approximately 6.35 mm (0.25 in.) to approximately 2 mm (0.125 in.) from the floor provides both the required stability and the ease of movement over a variety of floor surfaces.

The wheel 30 is permanently attached to the underside of the raised rail portion 36. The wheel 30 may include any type of caster, wheel, or attached device that enables movement of the server rack 10, including swivel, fixed, adjustable height, casters and equipped with brake features, skid shoes and glides. The height of the raised rail portion 36 may be determined based on the height and type of wheel 30. For example, a wheel 30 having a larger or smaller diameter may increase or decrease, respectively, the height of the raised rail portion 36 from the floor. A wheel 30 may be selected that continuously contacts the floor while the structure 100 is attached to the server rack 10. However, a wheel 30 having a diameter such that the bottom of the wheel does not contact the floor facilitates moving the server rack 10 over floors of varying heights, such as level concrete, carpet, and raised floor tiles which tend to be uneven.

Figure 5:
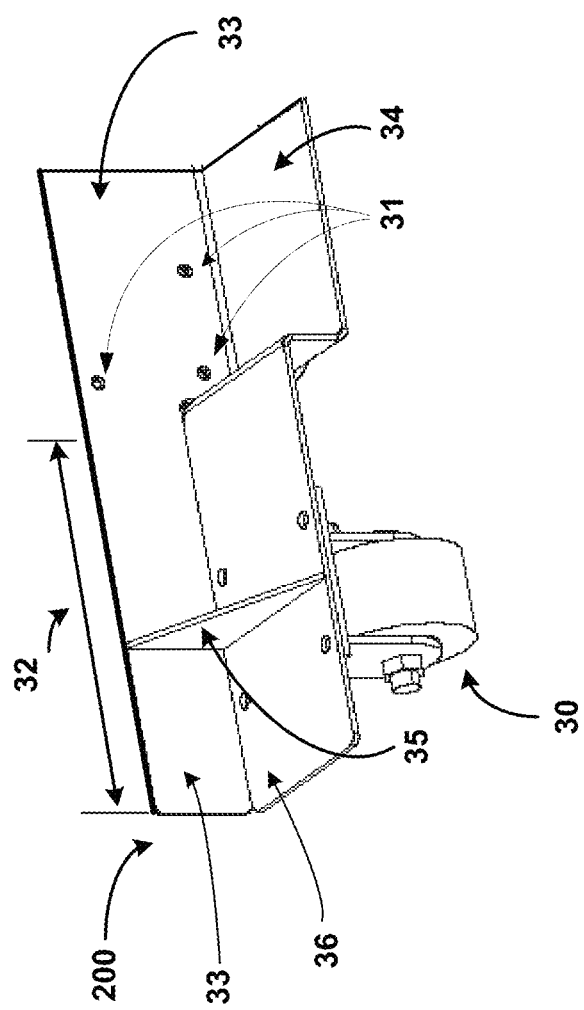
FIG. 5 is an alternate isometric view of one side of the mobility structure, according to an embodiment.
Figure 6:
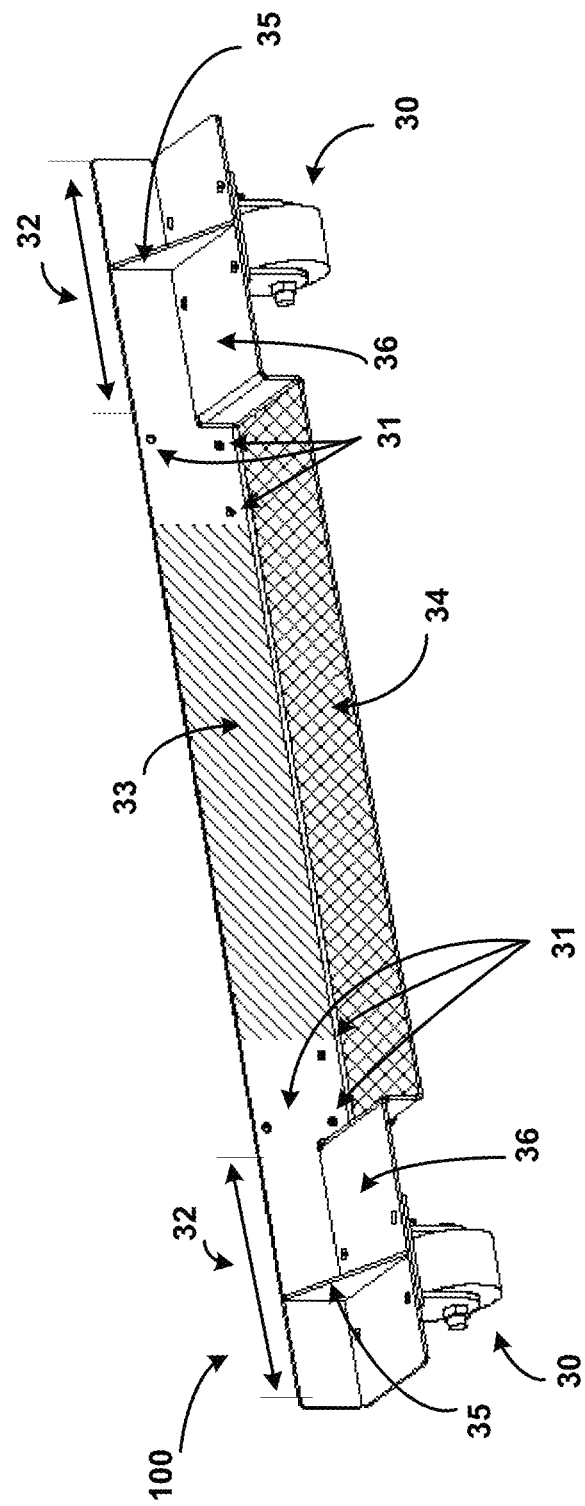
FIG. 6 is an alternate isometric view of the mobility structure, according to an embodiment.

FIGS. 5-6 illustrate a structure 200 which is an alternate embodiment of the structure 100 that is illustrated with reference to FIG. 4. Common components in FIGS. 5-6 having corresponding reference numerals to those illustrated in FIG. 4 perform the same functions as described previously.

FIG. 5 illustrates a left-hand portion of the structure 200. The left-hand portion and a corresponding right-hand portion (not shown) together comprise an alternate embodiment of the structure 100.

FIG. 6 illustrates those portions of the structure 100 that may be removed to form the alternate embodiment of structure 200 of FIG. 5. The diagonally-striped portion of the continuous fixed-length rail 33 may be removed, along with the cross-hatched section of the lower rail portion 34 to form two separate portions (left-hand and right-hand) of the structure 100. In an alternative embodiment, the diagonally-striped portion of the continuous fixed-length rail 33 may be removed, leaving the cross-hatched section of the lower rail portion 34 attached. In another alternative embodiment, the cross-hatched section of the lower rail portion 34 may be removed, leaving the diagonally-striped portion of the continuous fixed-length rail 33 attached.

FIG. 7 illustrates a method for installing a server rack 10 having the structure 100 attached. At step 20, the structure 100 is installed on Rack 2 prior to installing Rack 2. Rack 1 and Rack 3 are two in a line of server racks that are previously installed, for example, on the datacenter floor. At step 21, Rack 2 is rolled into position between Rack 1 and Rack 3. The front of Rack 2 may be installed substantially flush with those of Rack 1 and Rack 3, without first removing the structure 100, whether the structure 100 is attached to the front or the rear of the rack 10. At step 22, having been finally positioned between Rack 1 and Rack 3, the structure 100 is detached from the Rack 2. The structure 100 may be attached to either the front or the rear of the server rack 10.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A mobility apparatus comprising:
a left-hand rail portion and a right-hand rail portion each attached horizontally to a bottom structural member of a front of a server rack, wherein the apparatus is temporarily attached, by one or more removable fasteners, to the front of the server rack by at least one set of attachment points having at least three holes per attachment point;
a lower rail portion permanently attached to a lower edge of each of the left-hand rail portion and the right-hand rail portion;
a raised rail portion permanently attached to an extended length of the left-hand rail portion and an extended length of the right-hand rail portion, wherein each extended length extends laterally beyond the front of the server rack; and
at least one wheel attached to the extended length of each of the left-hand rail portion and the right-hand rail portion, wherein the at least one wheel is selected from a group consisting of: 1) a caster equipped with brake; 2) a swivel caster; 3) a fixed caster; 4) an adjustable height caster; 5) a skid shoe; and 6) a glide.

* * * * *